US012230575B2

(12) United States Patent
Kang et al.

(10) Patent No.: US 12,230,575 B2
(45) Date of Patent: Feb. 18, 2025

(54) CARRIER STRUCTURE INCLUDING POCKETS FOR ACCOMMODATING SEMICONDUCTOR CHIP STACK STRUCTURE

(71) Applicant: SAMSUNG ELECTRONICS CO., LTD., Suwon-si (KR)

(72) Inventors: Hyeongmun Kang, Hwaseong-si (KR); Woodong Lee, Cheonan-si (KR); Insup Shin, Seoul (KR); Youngwoo Lim, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 773 days.

(21) Appl. No.: 17/517,798

(22) Filed: Nov. 3, 2021

(65) Prior Publication Data

US 2022/0367367 A1  Nov. 17, 2022

(30) Foreign Application Priority Data

May 14, 2021 (KR) .................. 10-2021-0062838

(51) Int. Cl.
*H01L 23/538* (2006.01)
*H01L 25/065* (2023.01)
(52) U.S. Cl.
CPC ...... *H01L 23/5384* (2013.01); *H01L 23/5385* (2013.01); *H01L 23/5386* (2013.01); *H01L 25/0657* (2013.01)
(58) Field of Classification Search
CPC ............ H01L 23/5385; H01L 23/5384; H01L 23/5386; H01L 23/4985; H01L 24/73; H01L 24/79; H01L 24/86; H01L 21/67
See application file for complete search history.

(56) References Cited

U.S. PATENT DOCUMENTS

| 5,152,393 | A | 10/1992 | Chenoweth |
| 6,536,593 | B2 | 3/2003 | Hatakeyama |
| 6,981,595 | B2 | 1/2006 | Brahmbhatt et al. |
| 7,021,467 | B2 | 4/2006 | Agari |
| 2014/0305771 | A1* | 10/2014 | Ng .......................... B65G 15/30 198/713 |
| 2017/0154872 | A1 | 6/2017 | Moon et al. |
| 2022/0068884 | A1* | 3/2022 | Choi .................. H01L 23/5386 |

FOREIGN PATENT DOCUMENTS

| JP | 3678561 B2 | 8/2005 |
| JP | 3856542 B2 | 12/2006 |
| KR | 10-2017-0061816 A | 6/2017 |

* cited by examiner

*Primary Examiner* — Zandra V Smith
*Assistant Examiner* — John M Parker
(74) *Attorney, Agent, or Firm* — FINNEGAN, HENDERSON, FARABOW, GARRETT & DUNNER LLP

(57) ABSTRACT

A carrier structure including semiconductor chip stack structures; and a carrier tape including a plurality of pockets respectively accommodating the semiconductor chip stack structures, wherein each of the plurality of pockets includes a bottom surface, first sidewalls in four corner regions of each of the plurality of pockets, and second sidewalls between adjacent first sidewalls, each of the first sidewalls has a first portion having a first inclination angle and a second portion on the first portion and having a second inclination angle, the second inclination angle being greater than the first inclination angle, and vertices of lower surfaces of the semiconductor chip stack structures are in contact with the first sidewalls.

20 Claims, 8 Drawing Sheets

CARRIER STRUCTURE INCLUDING POCKETS FOR ACCOMMODATING SEMICONDUCTOR CHIP STACK STRUCTURE

CROSS-REFERENCE TO RELATED APPLICATION

This application claims the priority and benefit of Korean Patent Application No. 10-2021-0062838, filed on May 14, 2021, in the Korean Intellectual Property Office, the disclosure of which is incorporated herein by reference in its entirety.

BACKGROUND

1. Field

Embodiments relate to a carrier structure including a pocket for accommodating a semiconductor chip stack structure.

2. Description of the Related Art

A semiconductor device in a chip state may be processed and packaged in a form of a lead, a solder ball, or the like through which a bond pad formed on a surface of a chip may be connected to an external circuit through a packaging process. In addition, a market for packaging electronic products by being contained in carrier tape to protect the same from external impacts and moisture has been expanding.

SUMMARY

The embodiments may be realized by providing a carrier structure including semiconductor chip stack structures; and a carrier tape including a plurality of pockets respectively accommodating the semiconductor chip stack structures, wherein each of the semiconductor chip stack structures includes a base chip; a first through-via penetrating through the base chip; a plurality of semiconductor chips stacked on the base chip in a first direction, perpendicular to an upper surface of the base chip; a second through-via respectively penetrating through semiconductor chips below at least an uppermost semiconductor chip among the plurality of semiconductor chips; connection members between the base chip and a lowermost semiconductor chip among the plurality of semiconductor chips and between the plurality of semiconductor chips; and a molding member covering side surfaces of the plurality of semiconductor chips on the base chip, each of the plurality of pockets includes a bottom surface, first sidewalls in four corner regions of each of the plurality of pockets, and second sidewalls between adjacent first sidewalls, each of the first sidewalls has a first portion having a first inclination angle and a second portion on the first portion and having a second inclination angle, the second inclination angle being greater than the first inclination angle, and vertices of lower surfaces of the semiconductor chip stack structures are in contact with the first sidewalls.

The embodiments may be realized by providing a carrier structure, comprising a carrier tape including a plurality of pockets in which semiconductor chip stack structures are respectively accommodatable, wherein each of the semiconductor chip stack structures includes a base chip; a first through-via penetrating through the base chip; a plurality of semiconductor chips stacked in a first direction, perpendicular to the base chip; a second through-via respectively penetrating through semiconductor chips below at least an uppermost semiconductor chip among the plurality of semiconductor chips; connection members between the base chip and a lowermost semiconductor chip among the plurality of semiconductor chips and between the plurality of semiconductor chips; lowermost connection members below the uppermost semiconductor chip; and a molding member covering side surfaces of the plurality of semiconductor chips on the base chip, each of the plurality of pockets includes a bottom surface and sidewalls, at least one of the sidewalls including a first portion having a first inclination angle and a second portion on the first portion and having a second inclination angle, the first inclination angle is about 5° to about 15°, the second inclination angle is about 80° to about 90°, and a difference in height in a vertical direction between a lower end of the second portion and an upper end of the second portion is greater than a difference in height in the vertical direction between the bottom surface and an upper end of the first portion.

The embodiments may be realized by providing a carrier structure, comprising a carrier tape including a plurality of pockets in which semiconductor chip stack structures are respectively accommodatable, wherein each of the semiconductor chip stack structures includes a base chip; a first through-via penetrating through the base chip; a plurality of semiconductor chips stacked in a first direction, perpendicular to the base chip; a second through-via penetrating through each of the plurality of semiconductor chips; connection members between the base chip and a lowermost semiconductor chip among the plurality of semiconductor chips and between the plurality of semiconductor chips; and a molding member covering side surfaces of the plurality of semiconductor chips on the base chip, each of the plurality of pockets includes a bottom surface and sidewalls, the sidewalls include first sidewalls facing each other and second sidewalls facing each other, the carrier tape includes supports on the bottom surface and in contact with the first sidewalls, respectively, and spaced apart from the second sidewalls, in each of the plurality of pockets, a pocket portion, defined by the sidewalls, has an increasing width in a horizontal direction when moving away from the bottom surface in a vertical direction, and an upper surface of each of the supports is in contact with the at least a portion of a lower surface of the semiconductor chip stack structure.

BRIEF DESCRIPTION OF DRAWINGS

Features will be apparent to those of skill in the art by describing in detail exemplary embodiments with reference to the attached drawings in which.

DETAILED DESCRIPTION

Figure 1:
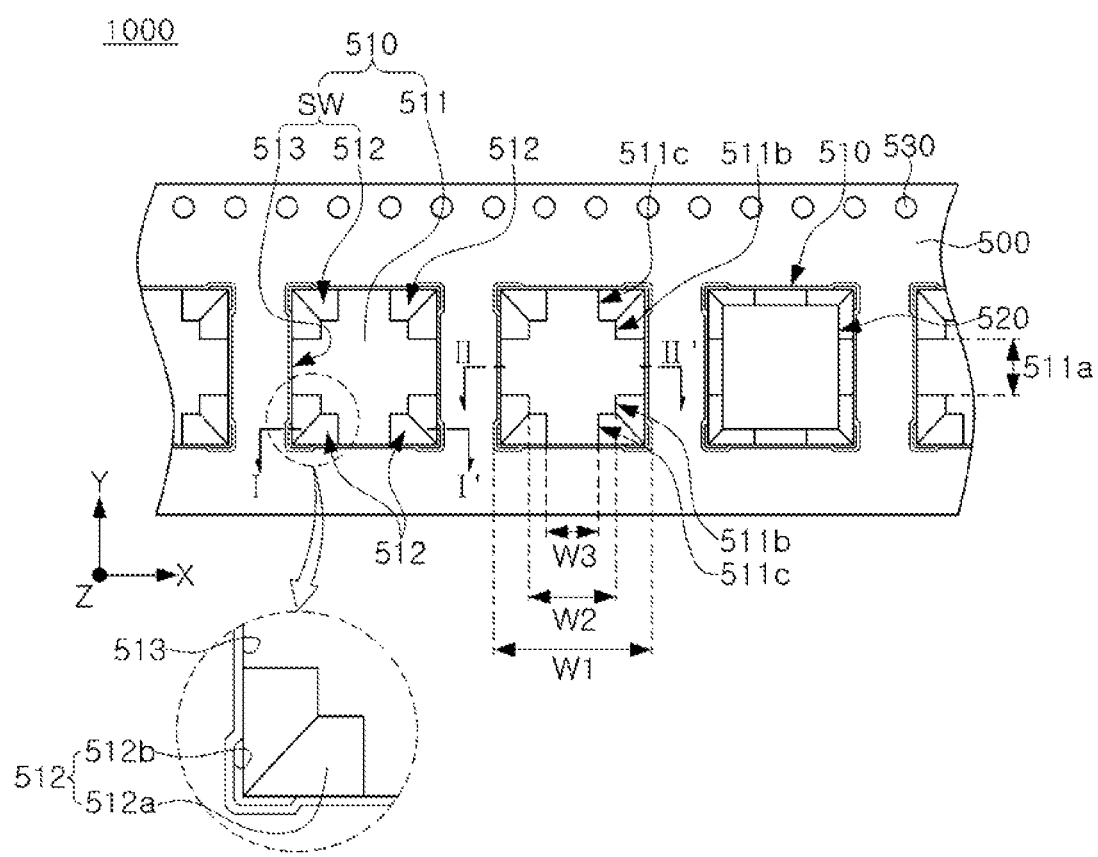
FIG. 1 is a plan view of a carrier structure according to example embodiments.

FIG. 1 is a plan view of a carrier structure according to example embodiments.

Referring to FIG. 1, a carrier structure 1000 may include carrier tape 500 including a plurality of pockets 510 and an electronic component 520 may be accommodated in each of the plurality of pockets 510. In an implementation, as illustrated in the drawings, the electronic component 520 may be accommodated in one of the plurality of pockets 510, or electronic components 520 may be accommodated in more than one, e.g., each, of the plurality of pockets 510.

The carrier tape 500 may be used as a packaging member for protecting the electronic component 520 when the electronic component 520 is transported or stored. The carrier tape 500 may include the plurality of pockets 510 for accommodating electronic components 520, and a transfer hole 530 to engage a sprocket and transfer the same.

Each of the plurality of pockets 510 may have a concave shape accommodating the electronic component 520. Each of the plurality of pockets 510 may include a bottom surface 511 and sidewalls SW. The sidewalls SW may include first sidewalls 512 in four corner regions of each of the plurality of pockets 510, and second sidewalls 513 between corner regions, adjacent to each other, among the corner regions. The first sidewalls 512 of one pocket 510 may not be connected to each other and may be spaced apart from each other. The first sidewalls 512 may include a first portion 512a and a second portion 512b having different inclinations (e.g., inclination angles) relative to each other. The second sidewalls 513 may extend from the bottom surface 511 and the first sidewalls 512.

The bottom surface 511 of the pocket 510 may include a first portion 511a in a center of the pocket 510 and having a first width W1 (e.g., in a X direction or a Y direction), second portions 511b at a position, symmetrical about the first portion 511a and having a second width W2, smaller than the first width W1, and third portions 511c at a position, symmetrical about the first portion 511a and having a third width W3, smaller than the first width W1 and the second width W2. The first to third portions 511a, 511b, and 511c of the bottom surface 511 may be in a single plane connected to, e.g., continuous with, each other.

Vertices or edges of a lower surface of the electronic component 520 may contact the sidewalls of the pocket 510. The vertices of the lower surface of the electronic component 520 may contact the first sidewalls 512.

Figure 2A:
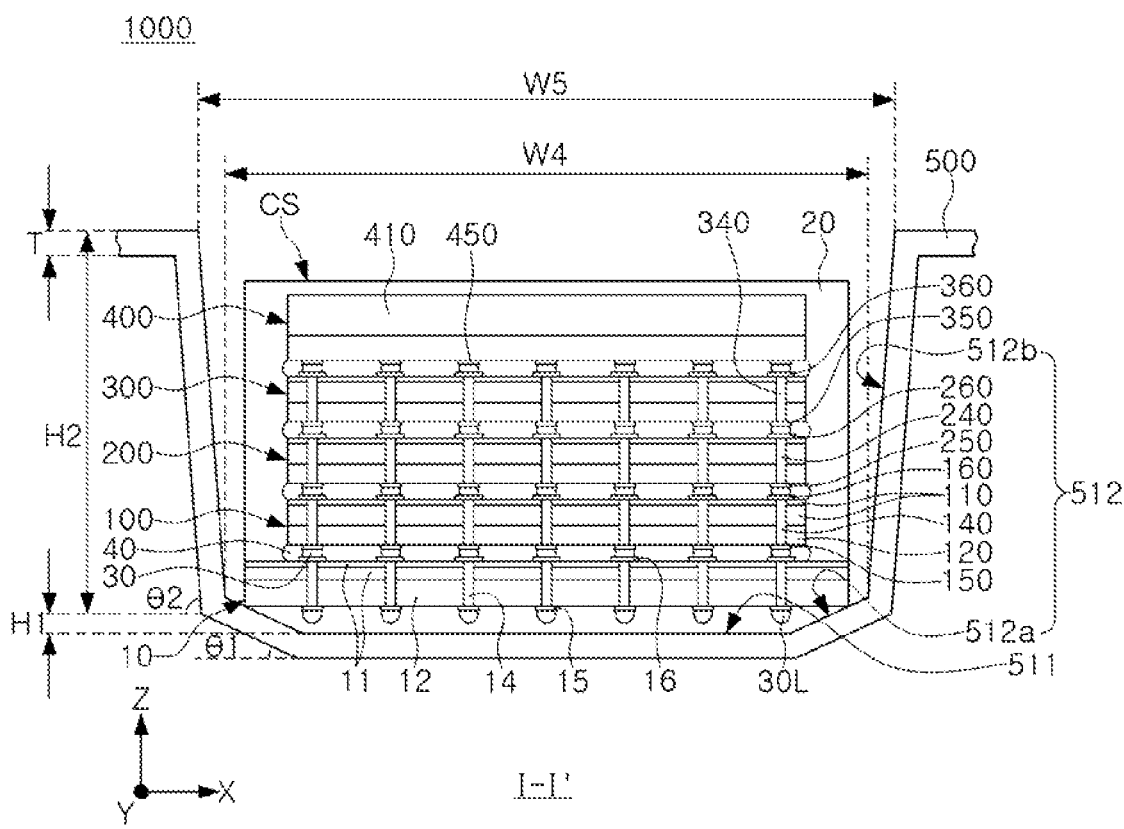
FIG. 2A is a cross-sectional view of a carrier structure according to example embodiments.
Figure 2B:
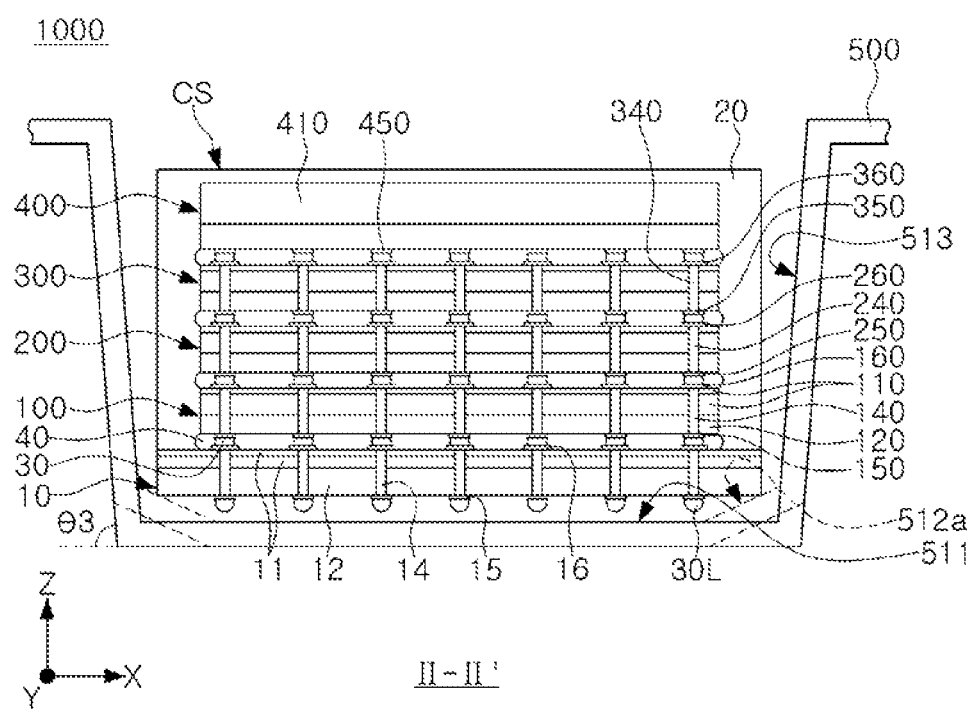
FIG. 2B is a cross-sectional view of a carrier structure according to example embodiments.

FIGS. 2A and 2B are cross-sectional views of a carrier structure according to example embodiments. FIG. 2A is a cross-sectional view taken along line I-I' of FIG. 1. FIG. 2B is a cross-sectional view taken along line II-II' of FIG. 1.

As shown in FIG. 2A, the first sidewall 512 of the pocket 510 may include a first portion 512a and a second portion 512b. The first portion 512a of the first sidewall 512 may have a first inclination (e.g., inclination angle) θ1 with respect to the bottom surface 511 (e.g., as measured from an outer surface relative to an extension of the bottom surface 511). The first portion 512a of the first sidewall 512 may extend from the bottom surface 511 inclined at a first inclination θ1. One pocket portion, defined by the first portions 512a of the first sidewalls 512, may have a greater or increasing width (e.g., in a horizontal direction) moving away from the bottom surface 511 in a Z direction (e.g., a first distance between the first portions 512a in the horizontal direction at a position proximate to the bottom surface 511 may be less than a second distance between the first portions 512a in the horizontal direction at a position distal to the bottom surface 511). Another pocket portion, defined by the second portions 512b of the first sidewalls 512, may also have a greater or increasing width moving away from the bottom surface 511 in a Z direction. The second portion 512b of the first sidewall 512 may (e.g., continuously) extend from the first portion 512a of the first sidewall 512. The second portion 512b of the first sidewall 512 may have a second inclination (e.g., inclination angle) θ2, different from the first inclination θ1 of the first portion 512a. In an implementation, the inclination of the second portion 512b of the first sidewall 512 (e.g., the second inclination θ2) may be greater than the first inclination θ1 of the first portion 512a.

The first portions 512a of the first sidewalls 512 may be inclined from the bottom surface 511 so that vertices of a lower surface of a semiconductor chip stack structure CS may be in contact therewith, and may be inclined surfaces. The inclined surfaces may be inclined to such an extent so that a lowermost connection member 30L of the semiconductor chip stack structure CS (to be described below) are not in contact with (e.g., spaced apart from) the bottom surface 511 of the pocket 510. In an implementation, the first portion 512a of the first sidewall 512 may be an inclined surface, inclined at about 5° to about 15° from the bottom surface 511. In an implementation, the first inclination θ1 may be an angle of about 5° to about 15°. Maintaining the first inclination θ1 at about 5° or greater may help prevent the lowermost connection member 30L from contacting the bottom surface 511 of the pocket 510. Maintaining the first inclination θ1 at about 15° or less may help prevent a decrease in accommodation stability of the semiconductor chip stack structure CS supported by the sidewalls SW (see, FIG. 1) of each pocket 510, e.g., which could otherwise occur due to an increased separation distance from the sidewalls SW (see, FIG. 1) of the pocket 510 and a side surface of the semiconductor chip stack structure CS.

The second portion 512b of the first sidewall 512 may be an inclined surface, inclined relatively close to vertical with respect to the bottom surface 511. The second portion 512b of the first sidewall 512 may be an inclined surface, inclined at about 80° to about 90° with respect to the bottom surface 511. In an implementation, the second inclination θ2 may be an angle of about 80° to about 90°.

A pocket portion, defined by the second portions 512b of the first sidewalls 512, may have a greater width moving away from the bottom surface 511 in the Z direction. The pocket portion, defined by the second portions 512b of the first sidewalls 512, may have a minimum width W4 and a maximum width W5 (e.g., in the X direction), and the minimum width W4 of the pocket portion may be, e.g., about 0.9 or more times the maximum width W5 of the pocket portion (e.g., about 0.9 times to less than 1 times, such that the minimum width W4 is less than the maximum width W5). In an implementation, the minimum width W4 of the pocket portion may be, e.g., about 0.95 or more times of the maximum width W5 of the pocket portion.

A difference in height H2 (e.g., in the Z direction) between a lower end of the second portion 512b of the first sidewall 512 and an upper end of the second portion 512b may be greater than a difference in height H1 between the bottom surface 511 and an upper end of the first portion 512a of the first sidewall 512. The difference in height H2 between the lower end of the second portion 512b of the first sidewall 512 and the upper end of the second portion 512b may be, e.g., 2 to 4 times the height difference H1 between the bottom surface 511 and the upper end of the first portion 512a of the first sidewall 512. In an implementation, the difference in height H2 between the lower end of the second portion 512b of the first sidewall 512 and the upper end of the second portion 512b thereof may be, e.g., about 2 to 3.5 times the height difference H1 between the bottom surface 511 and the upper end of the first portion 512a of the first sidewall 512.

In an implementation, a maximum thickness T of the carrier tape 500 may be greater than the difference in height H1 between the bottom surface 511 and the upper end of the first portion 512a of the first sidewall 512. In an implementation, the maximum thickness T of the carrier tape 500 may be substantially equal to the difference in height H1 between the bottom surface 511 and the upper end of the first portion 512a of the first sidewall 512.

In an implementation, an electronic component 520 accommodated in each of the plurality of pockets 510 may be a semiconductor chip stack structure CS. At least a portion of the semiconductor chip stack structure CS may contact the first sidewalls 512 of the pocket 510. In an implementation, one pocket 510 may include first sidewalls 512 respectively in four corner regions, four corners or vertices of a lower surface of the semiconductor chip stack structure CS may be accommodated in contact with the first sidewalls 512 of the pocket 510. In an implementation, the four corners or vertices of the lower surface of the semiconductor chip stack structure CS may contact the first portion 512a of the first sidewalls 512. In an implementation, only the vertices of the semiconductor chip stack structure CS may be in contact with the carrier tape 500, rather than a specific surface of the semiconductor chip stack structure CS, and a contact area between the semiconductor chip stack structure CS and the carrier tape 500 may be reduced. In an implementation, the contact area between the semiconductor chip stack structure CS and the carrier tape 500 may be reduced, and a degree of contamination (e.g., which could otherwise occur due to the contact of the semiconductor chip stack structure CS with the carrier tape 500) may be reduced.

As shown in FIG. 2B, the first portion 511a of the bottom surface 511 may be directly connected to second sidewalls 513. The second sidewalls 513 extending from the first portion 511a may not contact the semiconductor chip stack structure CS. In an implementation, in a region other than a corner of the pocket 510, the semiconductor chip stack structure CS may not contact the carrier tape 500. The corner region of the pocket 510 may include the first portion 512a of the first sidewall 512, and the carrier tape 500 may not contact the semiconductor chip stack structure CS in a central region, excluding the corner region of the pocket 510.

As shown in FIG. 2B, the second sidewalls 513 may have a third inclination θ3 greater than the first inclination θ1 of the first portion 512a of the first sidewalls 512 (see FIG. 2A). The third inclination θ3 of the second sidewalls 513 may be substantially equal to the second inclination θ2 of the first sidewalls 512 (see FIG. 2A).

The semiconductor chip stack structure CS may include a base chip 10 and a plurality of semiconductor chips 100, 200, 300, and 400 stacked on the base chip 10 in a vertical direction (e.g., the Z direction). In an implementation, the semiconductor chip stack structure CS may further include a molding member 20, a connection member 30 electrically connecting the base chip 10 to the plurality of semiconductor chips 100, 200, 300, and 400, or a non-conductive film 40 surrounding the connection member 30 between the base chip 10 and the plurality of semiconductor chips 100, 200, 300, and 400. The semiconductor chip stack structure CS may further include a first through-via 14 penetrating through at least a portion of the base chip 10 and second through-vias 140, 240, and 340 penetrating through at least portions of the plurality of semiconductor chips 100, 200, 300, and 400. The semiconductor chip stack structure CS may further include the lowermost connection member 30L below the base chip 10 (e.g., between the base chip 10 and the carrier tape 500).

In an implementation, four corners or vertices of a lower surface of the base chip 10 may contact sidewalls of the pocket 510. Four corners or vertices of the base chip 10 may contact the first sidewalls 512 of the pocket 510. The four corners or vertices of the base chip 10 may contact the first portion 512a of the first sidewalls 512 of the pocket 510.

A width of the base chip 10 in a horizontal direction (e.g., X direction) may be greater than a width of the plurality of semiconductor chips 100, 200, 300, and 400 in the horizontal direction. This may be due to a process of sequentially stacking the plurality of semiconductor chips 100, 200, 300, and 400 in a chip or die state on a base chip 10 in a wafer state, and cutting the base chip 10 into individual chips.

The base chip 10 may include a base substrate 11, a circuit structure 12 on a lower surface of the base substrate 11, a first through-via 14 penetrating through at least portions of the base substrate 11 and the circuit structure 12, and a lower connection pad 15 and an upper connection pad 16 respectively on a lower surface and an upper surface of the base chip 10. The base chip 10 may be a dummy semiconductor chip not including individual devices, unlike the plurality of semiconductor chips 100, 200, 300, and 400 stacked thereon. The base chip 10 may be a buffer chip that may receive a control signal, a power signal, or a ground signal for an operation of the plurality of semiconductor chips 100, 200, 300, and 400 from an outside through the first through-via 14, or receive a data signal to be stored in the plurality of semiconductor chips 100, 200, 300, and 400 from an outside, or that may provide the data stored in the plurality of semiconductor chips 100, 200, 300, and 400 externally.

In an implementation, the vertices or edges of the lower surface of the base chip 10 may contact the first sidewalls 512. In an implementation, the vertices of the lower surface of the base chip 10 may contact the first portion 512a of the first sidewalls 512.

The base substrate 11 may include, e.g., a semiconductor layer including silicon or the like, and a rear insulating film on the semiconductor layer. The rear insulating film may include a silicon oxide layer, a silicon nitride film, a polymer film, or the like. The circuit structure 12 may include a silicon oxide film, a silicon nitride film, or a combination thereof, an interlayer insulating film and a wiring structure in the interlayer insulating film. The first through-via 14 may extend from an upper surface to a lower surface of the base chip 10 penetrating through the base substrate 11 and the circuit structure 12. In an implementation, the first through-via 14 may penetrate through the circuit structure 12 to be directly connected to the lower connection pad 15 as shown in the drawing. In an implementation, the first through-via 14 may penetrate through only the base substrate 11 and may be electrically connected to the lower connection pad 15 through a wiring structure of the circuit structure 12. The connection pads 15 and 16 may include, e.g., aluminum (Al), copper (Cu), nickel (Ni), tungsten (W), platinum (Pt), or gold (Au).

The molding member 20 may seal the plurality of semiconductor chips 100, 200, 300, and 400 on the base chip 10. The molding member 20 may respectively cover side surfaces of the plurality of semiconductor chips 100, 200, 300, and 400 so that they are not exposed externally. In an implementation, as illustrated in the drawings, the molding member 20 may cover an upper surface of an uppermost semiconductor chip 400, or the molding member 20 may expose the upper surface of the uppermost semiconductor chip 400. The molding member 20 may include an insulating resin, e.g., EMC.

In an implementation, the vertices of the lower surface of the base chip 10 may be in contact with the first sidewall 512 of the pocket 510, and the molding member 20 encapsulating the plurality of semiconductor chips 100, 200, 300, and 400 on the base chip 10 may be spaced apart from the first sidewalls 512 and the second sidewalls 513 of the pocket 510. In an implementation, the molding member 20 may not be in contact with sidewalls SW (see FIG. 1) of the pocket 510.

The connection member 30 and the lowermost connection member 30L may include, e.g., a conductive material. The connection member 30 and the lowermost connection member 30L may have a land, ball, or pin structure. The connection member 30 and the lowermost connection member 30L may have a multilayer structure including copper pillar and solder, or a single-layer structure including tin-silver solder or copper.

The lowermost connection member 30L below the base chip 10 may be spaced apart from the bottom surface 511, the first sidewalls 512, and the second sidewalls 513 of the pocket 510.

The non-conductive film 40 may include an adhesive resin and may adhere the plurality of semiconductor chips 100, 200, 300, and 400 to each other. The adhesive resin may be a thermosetting resin, and may include, e.g., an epoxy resin.

The plurality of semiconductor chips 100, 200, 300, and 400 may include first to fourth semiconductor chips 100, 200, 300, and 400 stacked in the vertical direction (Z direction). Each of the plurality of semiconductor chips 100, 200, 300, 400 may include a semiconductor substrate 110, a circuit structure 120, second through-vias 140, 240, and 340, and front pads 150, 250, 350, and 450 and rear pads 160, 260 and 360.

The semiconductor substrate 110 may include, e.g., a semiconductor layer including silicon or the like, and a rear insulating film on the semiconductor layer. The rear insulating film may include a silicon oxide film, a silicon nitride film, a polymer film, or the like. The circuit structure 120 may include a silicon oxide film, a silicon nitride film, or a combination thereof, an interlayer insulating film and a wiring structure in the interlayer insulating film. The second through-vias 140, 240, and 340 may penetrate through semiconductor chips below at least the uppermost semiconductor chip 400 among the plurality of semiconductor chips 100, 200, 300, and 400, respectively. In an implementation, as shown in the drawings, the second through-vias 140, 240, and 340 may penetrate through the circuit structure 120 to be directly connected to the front pads 150, 250, and 350. In an implementation, the second through-vias 140, 240, and 340 may penetrate through only the semiconductor substrate 110, and may be electrically connected to the front pads 150, 250, and 350 through the wiring structure of the circuit structure 120. The front pads 150, 250, 350, and 450 and the rear pads 160, 260, and 360 may include, e.g., aluminum (Al), copper (Cu), nickel (Ni), tungsten (W), platinum (Pt), or gold (Au).

The first rear pad 160 on an upper surface of the first semiconductor chip 100 and the second front pad 250 on a lower surface of the second semiconductor chip 200 may be electrically connected through the connection member 30. In an implementation, the base chip 10 and the first semiconductor chip 100, the second semiconductor chip 200 and the third semiconductor chip 300, and the third semiconductor chip 300 and the fourth semiconductor chip 400 may be physically and electrically connected. Each of the first to fourth semiconductor chips 100, 200, 300, and 400 may be a memory chip or a logic chip. In an implementation, the plurality of semiconductor chips 100, 200, 300, and 400 may include a volatile memory chip such as DRAM or SRAM or a non-volatile memory chip such as PRAM, MRAM, RRAM, and flash memory.

The plurality of semiconductor chips 100, 200, 300, and 400 may be electrically connected to each other through second through-vias 140, 240, 340 and a connection member 30. The second through vias 140, 240, and 340 may be connected to front pads 150, 250, 350 and rear pads 160, 260, and 360.

Hereinafter, the descriptions described with reference to FIGS. 1 to 2B may be applied to components indicated by the same reference numerals.

Figure 3:
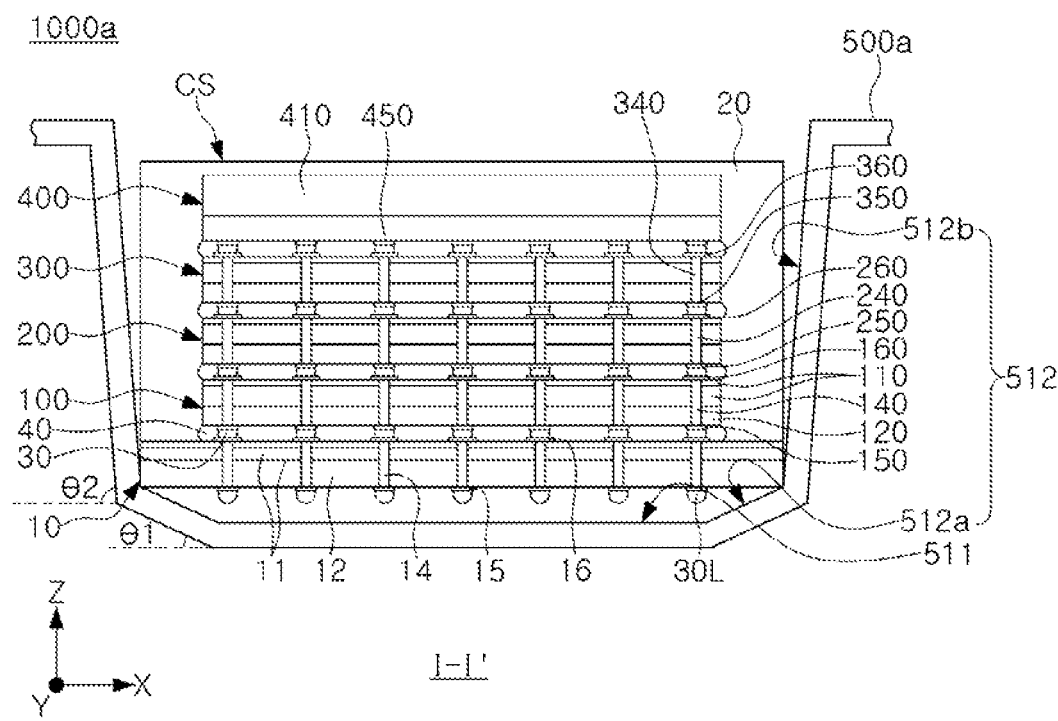
FIG. 3 is a cross-sectional view of a carrier structure according to example embodiments.

FIG. 3 is a cross-sectional view of a carrier structure according to example embodiments. FIG. 3 is a cross-sectional view of a region corresponding to a cross-section I-I' of FIG. 1.

Referring to FIG. 3, in a carrier structure 1000a, four vertices of a lowermost surface of a semiconductor chip stack structure CS may be in contact with at least one of first portions 512a and second portions 512b of first sidewalls 512 of a pocket 510 of carrier tape 500a. In an implementation, the four vertices of a lowermost surface of the semiconductor chip stack structure CS may contact a boundary point at which the first portion 512a and the second portion 512b of the first sidewalls 512 (having different inclination each other) meet. In an implementation, the vertices of the lower surface of the base chip 10 of the semiconductor chip stack structure CS may be in contact with the boundary point in which the first portion 512a of the first sidewall 512 and the second portion 512b of the first sidewall 512 meet.

Figure 4:
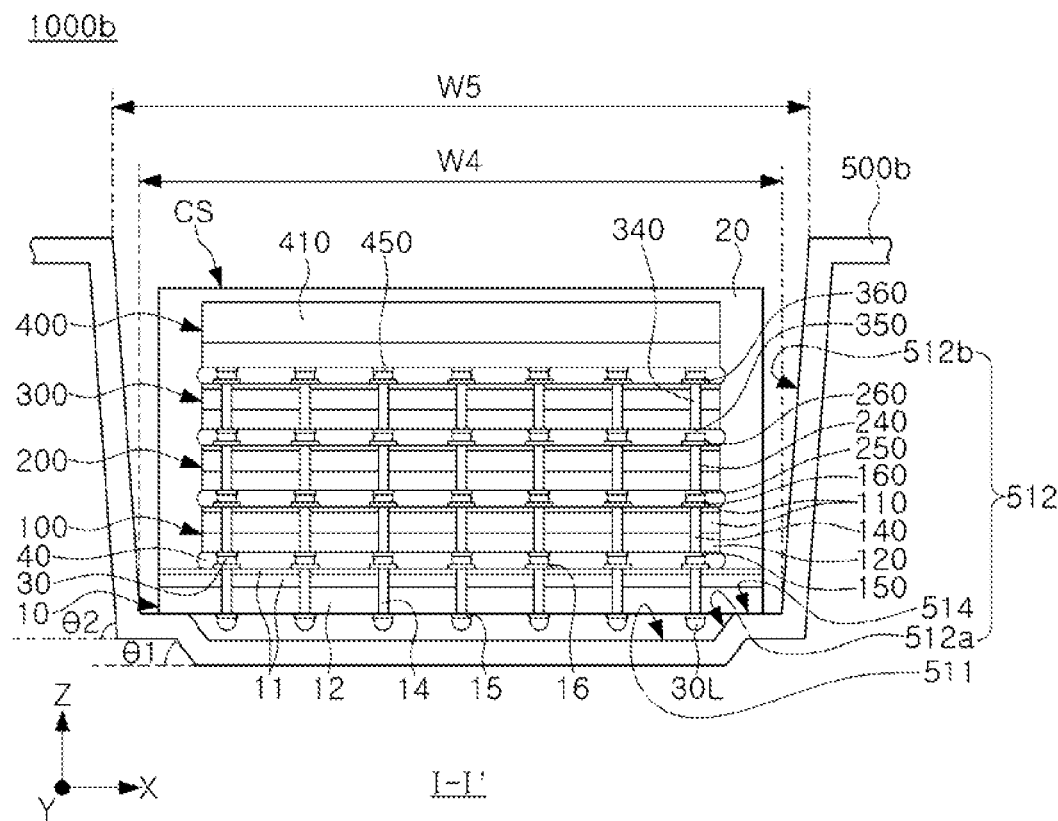
FIG. 4 is a cross-sectional view of a carrier structure according to example embodiments.

FIG. 4 is a cross-sectional view illustrating a carrier structure according to example embodiments. FIG. 4 is a cross-sectional view illustrating a region corresponding to the cross-section I-I' of FIG. 1.

Referring to FIG. 4, in a carrier structure 1000b, a pocket 510 of carrier tape 500b may include first sidewalls 512 having a first portion 512a and a second portion 512b having different inclinations from each other. The first sidewalls 512 may further include a support portion 514 connecting the first portion 512a to the second portion 512b between the first portion 512a and the second portion 512b.

The support portion 514 may be parallel to a bottom surface 511. The first sidewalls 512 of the plurality of pockets 510 of the carrier tape 500b may have a stepped shape. In an implementation, as illustrated in the drawings, the pocket 510 of the carrier tape 500b may have a two-layer stepped shape while including one support portion 514, disposed parallel to the bottom surface 511, or may have a stepped shape of two or more floors or levels while including a plurality of support portions on different levels.

At least a portion of a lowermost surface of a semiconductor chip stack structure CS may contact the support portion 514. Even in this case, a molding member 20 may be spaced apart from sidewalls SW (see, FIG. 1) including the first sidewall 512 of the pocket 510 and may not be in contact with the sidewalls SW. In an implementation, a lowermost connection member 30L may not be in contact with the bottom surface 511 of the pocket 510.

A distance (in the Z direction) from the bottom surface 511 of the pocket 510 an upper end of the support portion 514 may be, e.g., about 1 mm to about 2 mm. In an implementation, the distance from the bottom surface 511 of the pocket 510 to the top of the support portion 514 may be, e.g., about 1 mm to about 1.5 mm. In an implementation, a height of a step portion may be, e.g., about 1 mm to about 2 mm.

In an implementation, inclinations of the first portion 512a of the first sidewall 512 and the second portion 512b of the first sidewall 512 may be different from each other. In an implementation, the inclinations θ1 and θ2 of the first portion 512a of the first sidewall 512 and the second portion 512b of the first sidewall 512 may be substantially the same.

In an implementation, the first portion 512a and the second portion 512b of the first sidewall 512 may be inclined with respect to the bottom surface 511. In an implementation, the first portion 512a and/or the second portion 512b of the first sidewall 512 may be vertically disposed relative to the bottom surface 511.

Figure 5:
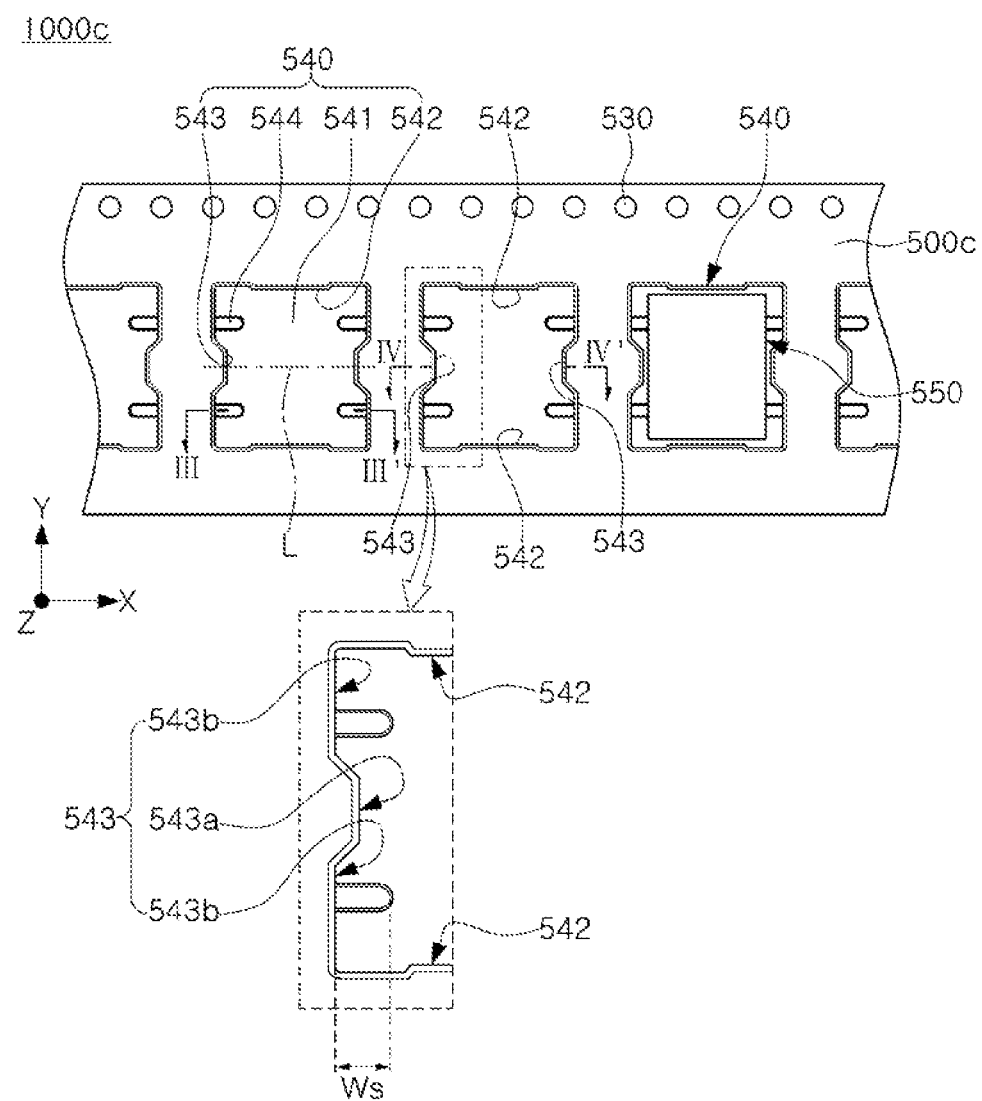
FIG. 5 is a plan view of a carrier structure according to example embodiments.

FIG. 5 is a plan view of a carrier structure according to example embodiments.

Referring to FIG. 5, a carrier structure 1000c may include carrier tape 500c including a plurality of pockets 540 and an electronic component 550 accommodated in each of the plurality of pockets 540. In an implementation, as illustrated in the drawings, the electronic component 550 may be accommodated in one of the plurality of pockets 540, or the electronic components 550 may be accommodated in each of the plurality of pockets 540.

Each of the plurality of pockets 540 may include a bottom surface 541, sidewalls 542 and 543, and a support 544.

The sidewalls 542 and 543 may include first sidewalls 543 facing each other and second sidewalls 542 facing each other.

The pocket 540 may be symmetrical with respect to a center line L along the X direction of the pocket 540. The pocket 540 may have a smaller width (e.g., in the X direction) in a region, adjacent to the center line L than in a region, spaced away (e.g., in the Y direction) from the center line L. The first sidewalls 543 of the pocket 540 may include a concave portion 543a that is concavely recessed and a protrusion 543b that is relatively protruding in a plan view, respectively.

The supports 544 may contact sidewalls of each of the plurality of pockets 540. The supports 544 may be on the bottom surface 541 of the pocket 540, and may contact the first sidewalls 542 of the pocket 540. The supports 544 may contact the protrusions 543b of the first sidewalls 543. The supports 544 may be spaced apart from the second sidewalls 542. In an implementation, the supports 544 may be in contact with the first sidewalls 543 of the pocket 540, only a part of the supports 544 may be in contact with an edge of a lower surface of the electronic component 550 to be accommodated, and a degree of contamination due to contact with the carrier tape 500c may be reduced.

The electronic component 550 may be inside each of the plurality of pockets 540. The electronic component 550 may be on the supports 544. At least a portion of the electronic component 550 may contact the supports 544.

Figure 6A:
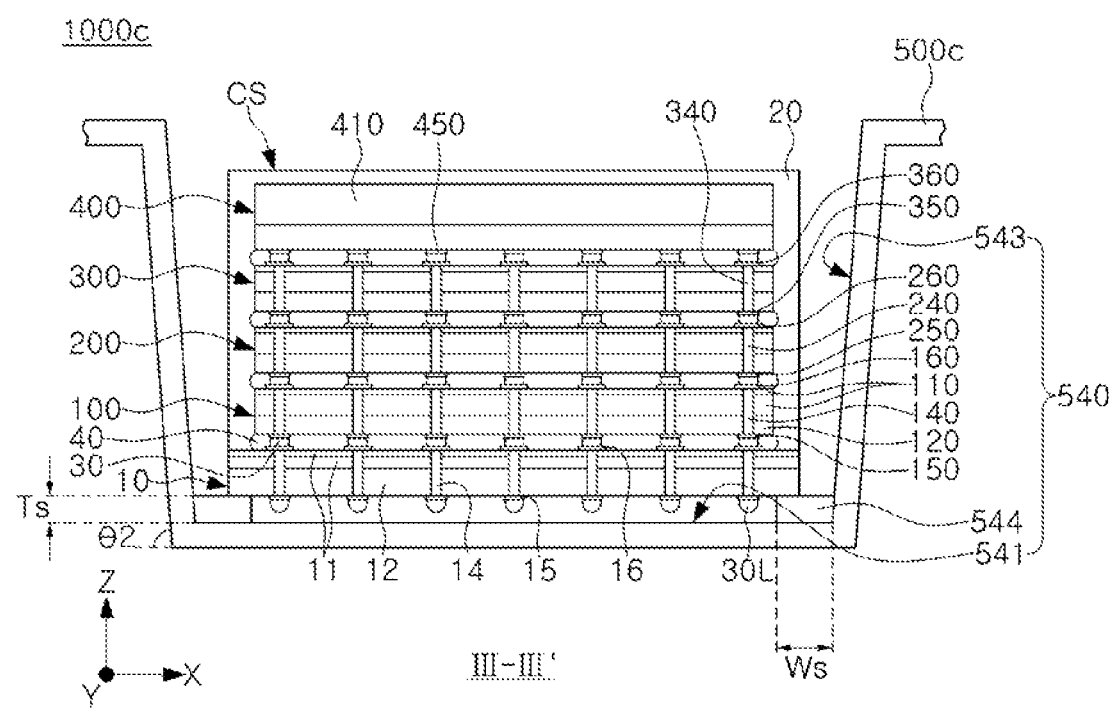
FIG. 6A is a cross-sectional view of a carrier structure according to example embodiments.
Figure 6B:
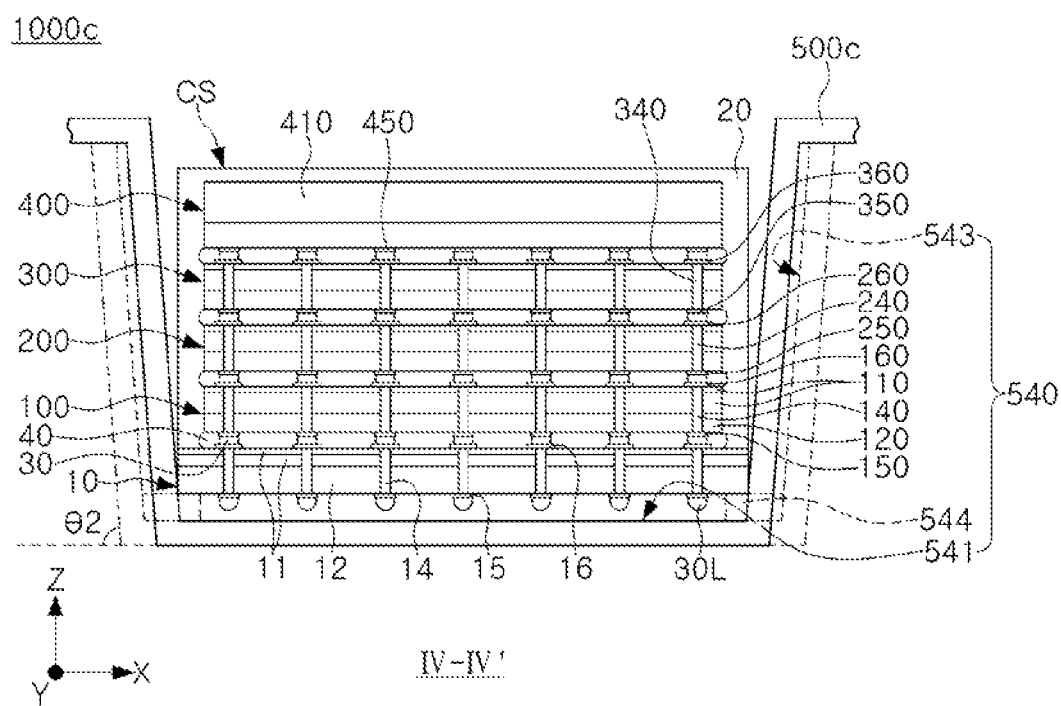
FIG. 6B is a cross-sectional view of a carrier structure according to example embodiments.

FIGS. 6A and 6B are cross-sectional views of a carrier structure according to example embodiments. FIG. 6A is a cross-sectional view taken along line of FIG. 5. FIG. 6B is a cross-sectional view taken along line IV-IV' of FIG. 5.

The pocket 540 may include the bottom surface 541, and the first sidewalls 543 extending from a bottom surface 541. A pocket portion, defined by the first sidewalls 543, may have an increasing width (e.g., in the X direction) moving away from the bottom surface 541 (e.g., in the Z direction). The first sidewalls 543 may be inclined surfaces having an inclination of less than 90° with respect to the bottom surface 541.

The supports 544 may be at an edge of the pocket 540 and may contact the first sidewalls 543. The supports 544, spaced apart in the X direction, may contact the first sidewalls 543 facing each other, respectively. Each of the supports 544 may have a width Ws (e.g., in the X direction), greater than a height Ts (e.g., in the Z direction) from the bottom surface 541. The height Ts of the supports 544 may be, e.g., about 1 mm to about 2 mm. In an implementation, the height Ts of the supports 544 may be, e.g., about 1 mm to about 1.5 mm. The width Ws of each of the supports 544 may be, e.g., about 1.5 mm to about 2.3 mm. In an implementation, the width Ws of each of the supports 544 may be, e.g., about 1.5 mm to about 2 mm.

In an implementation, an electronic component 550 accommodated in each of the plurality of pockets 540 may be a semiconductor chip stack structure CS. The semiconductor chip stack structure CS may include the same technical features as those described with reference to FIGS. 2A and 2B.

An upper surface of each of the supports 544 may contact at least a portion of a lower surface of the semiconductor chip stack structure CS. The upper surface of each of the supports 544 may be in contact with at least a portion of a lower surface of the base chip 10, and may be disposed in such a manner that lowermost connection members 30L are not in contact with the bottom surface 541 of the pocket 540.

As set forth above, according to example embodiments, a carrier structure for preventing damage to a semiconductor chip stack structure by accommodating the semiconductor chip stack structure in carrier tape having an inclined sidewall may be provided.

According to example embodiments, a carrier structure for preventing damage to a semiconductor chip stack structure by accommodating the semiconductor chip stack structure in carrier tape including a support may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to by terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element. As used herein, the term "or" is not an exclusive term, e.g., "A or B" would include A, B, or A and B.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A carrier structure, comprising:
   semiconductor chip stack structures; and
   a carrier tape including a plurality of pockets respectively accommodating the semiconductor chip stack structures,
   wherein:
   each of the semiconductor chip stack structures includes:
     a base chip;
     a first through-via penetrating through the base chip;
     a plurality of semiconductor chips stacked on the base chip in a first direction, perpendicular to an upper surface of the base chip;
     a second through-via respectively penetrating through semiconductor chips below at least an uppermost semiconductor chip among the plurality of semiconductor chips;
     connection members between the base chip and a lowermost semiconductor chip among the plurality of semiconductor chips and between the plurality of semiconductor chips; and
     a molding member covering side surfaces of the plurality of semiconductor chips on the base chip,
   each of the plurality of pockets includes a bottom surface, first sidewalls in four corner regions of each of the plurality of pockets, and second sidewalls between adjacent first sidewalls,
   each of the first sidewalls has a first portion having a first inclination angle and a second portion on the first portion and having a second inclination angle, the second inclination angle being greater than the first inclination angle, and
   vertices of lower surfaces of the semiconductor chip stack structures are in contact with the first sidewalls.

2. The carrier structure as claimed in claim 1, wherein, in each of the plurality of pockets, the molding member is spaced apart from the first sidewalls and the second sidewalls.

3. The carrier structure as claimed in claim 1, wherein vertices of the lower surfaces of the base chips are in contact with the first portions of the first sidewalls.

4. The carrier structure as claimed in claim 1, wherein:
   each of the semiconductor chip stack structures further includes a lowermost connection member below the base chip, and
   the lowermost connection members are spaced apart from the bottom surface, the first sidewalls, and the second sidewalls of each of the plurality of pockets.

5. The carrier structure as claimed in claim 1, wherein, in each of the first sidewalls, the first portion extends from the bottom surface, and the second portion extends from the first portion.

6. The carrier structure as claimed in claim 1, wherein the second sidewalls extend from the bottom surface.

7. The carrier structure as claimed in claim 1, wherein each of the second sidewalls has a third inclination angle that is greater than the first inclination angle.

8. The carrier structure as claimed in claim 7, wherein the third inclination angle is substantially equal to the second inclination angle.

9. The carrier structure as claimed in claim 1, wherein the first inclination angle is about 5° to about 15°.

10. The carrier structure as claimed in claim 1, wherein the second inclination angle is about 80° to about 90°.

11. The carrier structure as claimed in claim 1, wherein, in each of the plurality of pockets, a pocket portion, defined by the second portions of the first sidewalls, has an increasing width in a horizontal direction when moving away from the bottom surface in a vertical direction.

12. The carrier structure as claimed in claim 1, wherein, in each of the plurality of pockets:
    a pocket portion, defined by the second portions of the first sidewalls, has a minimum width and a maximum width, and
    the minimum width is about 0.9 to less than 1.0 times the maximum width.

13. The carrier structure as claimed in claim 1, wherein:
    each of the first sidewalls further includes a support portion connecting the first portion to the second portion between the first portion and the second portion, and
    the support portion is in contact with at least a portion of the lower surface of the semiconductor chip stack structure.

14. A carrier structure, comprising a carrier tape including a plurality of pockets in which semiconductor chip stack structures are respectively accommodatable,
    wherein:
    each of the semiconductor chip stack structures includes:
      a base chip;
      a first through-via penetrating through the base chip;
      a plurality of semiconductor chips stacked in a first direction, perpendicular to the base chip;
      a second through-via respectively penetrating through semiconductor chips below at least an uppermost semiconductor chip among the plurality of semiconductor chips;
      connection members between the base chip and a lowermost semiconductor chip among the plurality of semiconductor chips and between the plurality of semiconductor chips;

lowermost connection members below the uppermost semiconductor chip; and a molding member covering side surfaces of the plurality of semiconductor chips on the base chip, each of the plurality of pockets includes a bottom surface and sidewalls, at least one of the sidewalls including a first portion having a first inclination angle and a second portion on the first portion and having a second inclination angle, the first inclination angle is about 5° to about 15°, the second inclination angle is about 80° to about 90°, and a difference in height in a vertical direction between a lower end of the second portion and an upper end of the second portion is greater than a difference in height in the vertical direction between the bottom surface and an upper end of the first portion.

15. The carrier structure as claimed in claim 14, wherein the difference in height in the vertical direction between the lower end of the second portion and the upper end of the second portion is 2 to 4 times the difference in height in the vertical direction between the bottom surface and the upper end of the first portion.

16. The carrier structure as claimed in claim 14, wherein a maximum thickness of the carrier tape is greater than the difference in height in the vertical direction between the bottom surface and the upper end of the first portion.

17. The carrier structure as claimed in claim 14, wherein:
in each of the plurality of pockets, the sidewalls include first sidewalls in four corner regions of each of the plurality of pockets and second sidewalls between adjacent first sidewalls, and each of the first sidewalls includes the first portion and the second portion.

18. A carrier structure, comprising a carrier tape including a plurality of pockets in which semiconductor chip stack structures are respectively accommodatable, wherein:

each of the semiconductor chip stack structures includes:
a base chip;
a first through-via penetrating through the base chip;
a plurality of semiconductor chips stacked in a first direction, perpendicular to the base chip;
a second through-via penetrating through each of the plurality of semiconductor chips;
connection members between the base chip and a lowermost semiconductor chip among the plurality of semiconductor chips and between the plurality of semiconductor chips; and
a molding member covering side surfaces of the plurality of semiconductor chips on the base chip, each of the plurality of pockets includes a bottom surface and sidewalls, the sidewalls include first sidewalls facing each other and second sidewalls facing each other, the carrier tape includes supports on the bottom surface and in contact with the first sidewalls, respectively, and spaced apart from the second sidewalls, in each of the plurality of pockets, a pocket portion, defined by the sidewalls, has an increasing width in a horizontal direction when moving away from the bottom surface in a vertical direction, and an upper surface of each of the supports is in contact with the at least a portion of a lower surface of the semiconductor chip stack structure.

19. The carrier structure as claimed in claim 18, wherein a height in the vertical direction of each of the supports is about 1 mm to about 1.5 mm.

20. The carrier structure as claimed in claim 18, wherein a width in the horizontal direction of each of the supports is about 1.5 mm to about 2 mm.

* * * * *